United States Patent
Casci et al.

(10) Patent No.: US 11,264,164 B2
(45) Date of Patent: Mar. 1, 2022

(54) COOLING SYSTEM FOR AN INDUCTOR IN A POWER SUPPLY DEVICE OF A HYBRID/ELECTRIC VEHICLE

(71) Applicant: FORD GLOBAL TECHNOLOGIES, LLC, Dearborn, MI (US)

(72) Inventors: John P. Casci, Westland, MI (US); Moon Young Lee, Northville, MI (US); Vincent T. Skalski, Plymouth, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 151 days.

(21) Appl. No.: 16/686,938

(22) Filed: Nov. 18, 2019

(65) Prior Publication Data

US 2021/0151245 A1 May 20, 2021

(51) Int. Cl.
*H01F 27/28* (2006.01)
*H05K 7/20* (2006.01)
(Continued)

(52) U.S. Cl.
CPC .......... *H01F 27/2876* (2013.01); *B60K 6/22* (2013.01); *B60L 53/24* (2019.02); *H01F 27/24* (2013.01);
(Continued)

(58) Field of Classification Search
CPC .... H01F 27/2876; H01F 27/322; H01F 27/10; H01F 27/28; H01F 27/325; H01F 27/24; H01F 27/12; H01F 37/00; H01F 27/025; H01F 27/321; H05K 7/20845; H05K 7/2089; H05K 7/20927; B60Y 2400/61; B60Y 2200/91; B60Y 2200/92; B60Y 2306/05; B60L 5/32; B60L 58/26; B60L 53/24; B60L 2210/44; B60L 50/60; B60L 2210/14; B60L 1/02; B60L 50/16; B60K 6/08; B60K 6/22; Y02T 10/70; Y02T 10/7072; Y02T 90/14; H02P 27/06
See application file for complete search history.

(56) References Cited

U.S. PATENT DOCUMENTS

2003/0029932 A1* 2/2003 Nakano ............... F04D 15/0016
239/284.2
2014/0132378 A1* 5/2014 Vafakhah ................. B60K 6/22
336/55
(Continued)

FOREIGN PATENT DOCUMENTS

CN 109686539 A 4/2019
CN 208737978 U 4/2019
(Continued)

*Primary Examiner* — John W Poos
*Assistant Examiner* — Alex W Lam
(74) *Attorney, Agent, or Firm* — David B Kelley; Brooks Kushman P.C.

(57) ABSTRACT

An inductor for a boost converter in a hybrid vehicle includes a core, a coil winding, and an end cap. The coil winding is disposed about the core. The end cap is disposed over a first end of the inductor, overhangs the coil winding, defines a channel that is configured to receive fluid from a pump, defines at least one nozzle that is configured to direct fluid from an overhanging portion of the end cap and onto the coil, and defines a fluid reservoir that is in fluid communication with the channel and the at least one nozzle.

19 Claims, 3 Drawing Sheets

(51) Int. Cl.
  *H01F 27/24* (2006.01)
  *B60L 50/60* (2019.01)
  *B60L 53/24* (2019.01)
  *B60K 6/22* (2007.10)

(52) U.S. Cl.
  CPC ....... *H05K 7/2089* (2013.01); *H05K 7/20845* (2013.01); *B60L 50/60* (2019.02); *B60L 2210/14* (2013.01); *B60L 2210/44* (2013.01); *B60Y 2200/91* (2013.01); *B60Y 2200/92* (2013.01); *B60Y 2306/05* (2013.01); *B60Y 2400/61* (2013.01)

(56) References Cited

U.S. PATENT DOCUMENTS

2016/0153544 A1    6/2016  Dobbins et al.
2016/0368485 A1*  12/2016  Gibson ................ B60W 10/02
2018/0130589 A1    5/2018  Yonak et al.

FOREIGN PATENT DOCUMENTS

CN      209418265 U    9/2019
WO     2020164084 A1   8/2020

\* cited by examiner

US 11,264,164 B2

COOLING SYSTEM FOR AN INDUCTOR IN A POWER SUPPLY DEVICE OF A HYBRID/ELECTRIC VEHICLE

TECHNICAL FIELD

The present disclosure relates to hybrid/electric vehicles and power supply devices for hybrid, electric vehicles

BACKGROUND

Electric and hybrid vehicles may include power supply devices that are configured to convert electrical power from direct current (DC) into alternating current (AC) and/or vice versa.

SUMMARY

A vehicle includes an electric machine, a battery, an electrical circuit, and a boost converter. The electric machine is configured to propel the vehicle. The battery is configured to deliver electrical power to the electric machine. The electrical circuit is configured to convert direct current power from the battery into alternating current power and to deliver the alternating current power to the electric machine. The boost converter has an inductor and is configured to increase the battery voltage being input into the electrical circuit. The inductor comprises a core, a coil, a shroud, and a check valve. The shroud is disposed over a first end of the inductor. The shroud defines a channel that is in fluid communication with a transmission pump. The shroud also defines at least one nozzle that is in fluid communicating with the channel and is configured to direct transmission fluid onto the coil. The check valve is disposed within the channel between the transmission pump and the at least one nozzle. The check value is configured to prevent transmission fluid from backflowing through the channel toward the transmission pump.

An inductor for a boost converter in a hybrid vehicle includes a core, a coil winding, and an end cap. The coil winding is disposed about the core. The end cap is disposed over a first end of the inductor, overhangs the coil winding, defines a channel that is configured to receive fluid from a pump, defines at least one nozzle that is configured to direct fluid from an overhanging portion of the end cap and onto the coil, and defines a fluid reservoir that is in fluid communication with the channel and at least one nozzle.

An inductor for a boost converter in a hybrid vehicle includes a core, a coil winding, and a shroud. The coil winding is disposed about the core. The shroud is disposed over an upper end of the inductor. The shroud defines a channel that is configured to receive fluid from a pump. The shroud has an outer end that overhangs the coil winding. The outer end defines at least one nozzle that is configured to direct fluid from the channel and downward onto the coil.

DETAILED DESCRIPTION

Embodiments of the present disclosure are described herein. It is to be understood, however, that the disclosed embodiments are merely examples and other embodiments may take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the embodiments. As those of ordinary skill in the art will understand, various features illustrated and described with reference to any one of the figures may be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
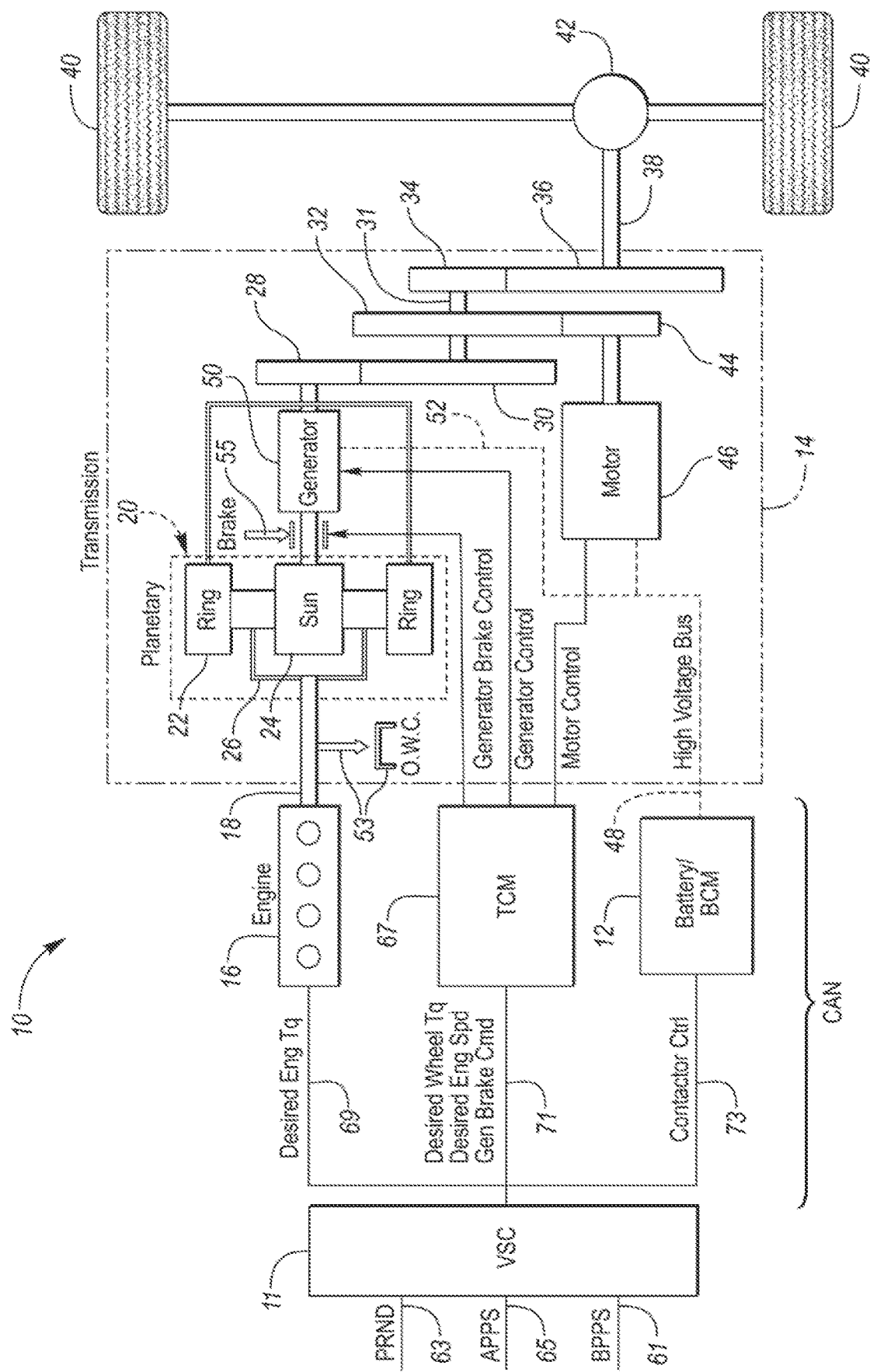
FIG. 1 is a schematic illustration of a representative powertrain of a hybrid electric vehicle.

Referring now to FIG. 1, a hybrid electric vehicle 10 having a powersplit powertrain is illustrated. The powertrain includes two power sources that are connected to the driveline: (1) an engine 16 and an electric machine 50 (which may be referred to as a generator) connected together via a planetary gear arrangement 20; and (2) an electric drive system including a battery 12 having a battery control module (BCM), an electric machine 46 (which may be referred to as a motor) and a generator 50. Battery 12 is an energy storage system for motor 46 and generator 50.

A vehicle system controller (VSC) 11 is configured to send control signals to and receive sensory feedback information from one or more of battery 12, engine 16, motor 46, and generator 50 in order for power to be provided to vehicle traction wheels 40 for propelling the vehicle 10. Controller 11 controls the power source proportioning between battery 12 and engine 16 for providing power to propel the vehicle 10 and thereby controls the state of charge (SOC) of battery 12.

Transmission 14 includes planetary arrangement 20, which includes a ring gear 22, a sun gear 24, and a carrier assembly 26. Ring gear 22 distributes torque to step ratio gears comprising meshing gear elements 28, 30, 32, 34, and 36. A torque output shaft 38 of transmission 14 is driveably connected to wheels 40 through a differential-and-axle mechanism 42. Gears 30, 32, and 34 are mounted on a counter shaft 31 with gear 32 engaging a motor-driven gear 44. Motor 46 drives gear 44. Gear 44 acts as a torque input for counter shaft 31. Engine 16 distributes torque through input shaft 18 to transmission 14. Battery 12 delivers electric power to motor 46 through power flow path 48. Generator 50 is connected electrically to battery 12 and to motor 46 through power flow path 52. The power flow paths 48 and 52 may include inverting circuitry to convert direct current power from the battery 12 into alternating current power, which may then be delivered to the motor 46 or generator 50 to increase the power output of the powertrain. The power flow paths 48 and 52 may also include rectifying circuitry to convert alternating current power from either the motor 46 or the generator 50 into direct current power, which may then be delivered to the battery 12 to recharge the battery 12, which may occur during regenerative braking or while the engine 16 is powering the generator 50.

While battery 12 is acting as a sole power source with engine 16 off, input shall 18 and carrier assembly 26 are braked by an overrunning coupling (i.e., one-way clutch (OWC)) 53. A mechanical brake 55 anchors the rotor of generator 50 and sun gear 24 when engine 16 is on and the powertrain is in a parallel drive mode, sun gear 24 acting as a reaction element.

Controller 11 receives a signal PRND (park, reverse, neutral, drive) from a transmission range selector 63, which is distributed to transmission control module (TCM) 67, together with a desired wheel torque, a desired engine speed, and a generator brake command, as shown at 71. A battery switch 73 is closed after vehicle "key-on" startup. Controller 11 issues a desired engine torque request to engine 16, as shown at 69, which is dependent on accelerator pedal position sensor (APPS) output 65. A brake pedal position sensor (BPPS) distributes a wheel brake signal to controller 11, as shown at 61. A brake system control module (not shown) may issue to controller 11 a regenerative braking command based on information from the BPPS. TCM 67 issues a generator brake control signal to generator brake 55. TCM 67 also distributes a generator control signal to generator 50.

The controllers illustrated in FIG. 1 (i.e., VSC 11, BCM, and TCM 67) may be part of a larger control system and may be controlled by various other controllers throughout the vehicle 10. It should therefore be understood that the controllers and one or more other controllers can collectively be referred to as a "controller" that controls various actuators in response to signals from various sensors to control functions such as starting/stopping engine 16, operating the motor 46 to provide wheel torque, operating the generator to charge the battery 12, etc. The controllers may include a microprocessor or central processing unit (CPU) in communication with various types of computer readable storage devices or media. Computer readable storage devices or media may include volatile and nonvolatile storage in read-only memory (ROM), random-access memory (RAM), and keep-alive memory (KAM), for example, KAM is a persistent or non-volatile memory that may be used to store various operating variables while the CPU is powered down. Computer-readable storage devices or media may be implemented using any of a number of known memory devices such as PROMs (programmable read-only memory), EPROMs (electrically PROM), EEPROMs (electrically erasable PROM), flash memory, or any other electric, magnetic, optical, or combination memory devices capable of storing data, some of which represent executable instructions, used by the controllers in controlling the vehicle 10.

It should be understood that the vehicle configuration described herein is merely exemplary and is not intended to be limited. Other hybrid or electric vehicle configurations should be construed as disclosed herein. Other vehicle configurations may include, but are not limited to, series hybrid vehicles, parallel hybrid vehicles, series-parallel hybrid vehicles, plug-in hybrid electric vehicles (PHEVs), fuel cell hybrid vehicles, battery operated electric vehicles (BEVs), or any other vehicle configuration known to a person of ordinary skill in the art.

Figure 2:
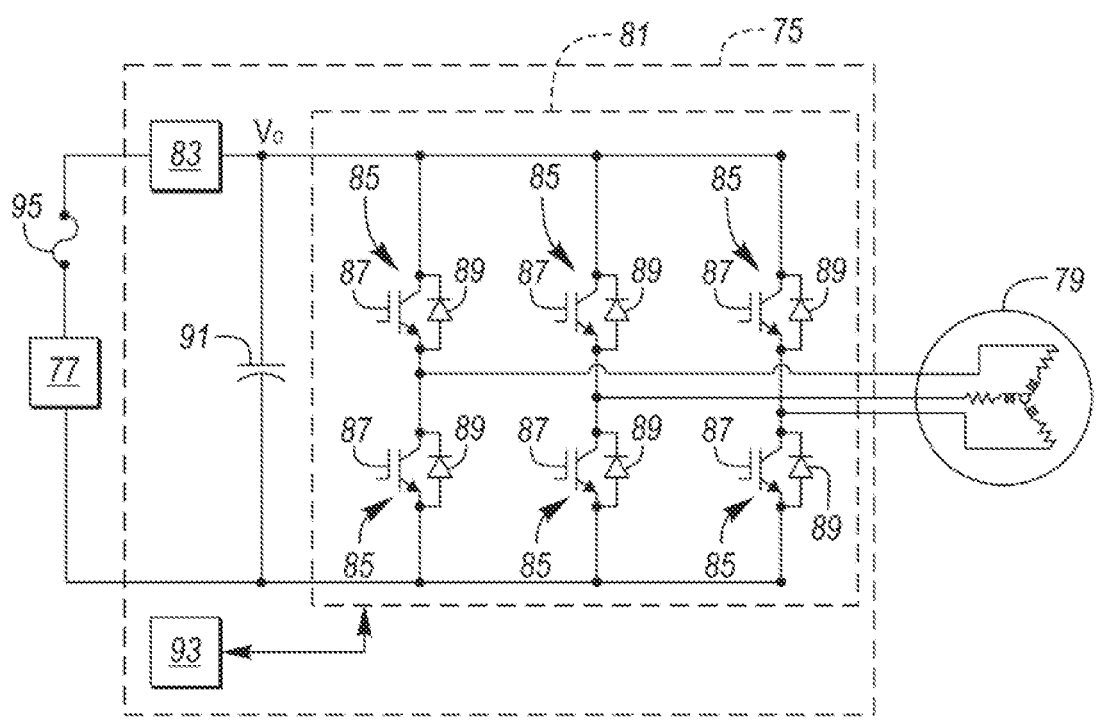
FIG. 2 is a circuit diagram of a power controller illustrating an inverter that is coupled to a DC power source and an electric machine.

Referring to FIG. 2, a circuit diagram of a power controller (or power supply device) 75 coupled to a power source 77 and an electric machine 79 is illustrated. The power source 77 may be the battery 12 and the electric machine 79 may be the motor 46 or generator 50 described in FIG. 1. The power controller 75 may be utilized in an electric drive system of the vehicle 10. The power source 77 may be coupled to the power controller 75 in order to drive the electric machine 79. The power controller 75 may include an inverter 81 and a voltage converter 83. The voltage converter 83 may be DC to DC boost converter, which is configured to increase the voltage of power source 77 being input into the inverter 81. The voltage converter 83 includes an inductor. The inverter 81 and the voltage converter 83 may be configured to deliver electrical power to the electric machine 79.

The inverter 81 includes inverting circuitry. The inverting circuitry may include switching units 85. The switching units 85 may each comprise a transistor 87, such as an insulated gate bipolar transistor (IGBT), in antiparallel with a diode 89. The switching units 85 may be configured to provide alternating current to the electric machine 79. More specifically, the inverter 81 may be configured to convert direct electrical current provided by the power source 77 into alternating electrical current, which is then delivered to the electric machine 79. The power controller 75 may include a linking capacitor 91. The linking capacitor 91 may be disposed between the power source 77 and the inverter 81. The linking capacitor 91 may be configured to absorb ripple currents generated at the inverter 81 or the power source 77, and stabilize the DC-link voltage, Vo, for inverter 81 control. Stated in other terms, the linking capacitor 91 may be arranged to limit voltage variation at an input of inverting circuitry due to ripple currents generated by the inverting circuitry or the power source 77. The power controller 75 may include a drive board 93 for controlling the inverting circuitry. The drive board 93 may be a gate drive board that is configured to operate the transistors 87 of the switching units 85 of the inverter 81 when converting the direct current of the power source 77 into alternating current and delivering the alternating current to the electric machine 79.

The voltage converter 83 may include an inductor. The circuitry of the voltage converter (not shown), including the inductor, may be configured to amplify or increase the voltage of the electrical power being delivered to the electric machine 79 from the power source 77. A fuse 95 may be disposed on the direct current side of the inverter 81 to protect the inverting circuitry from surges in electrical power.

The disclosure should not be construed as limited to the circuit diagram of FIG. 2, but should include power control devices that include other types inverters, capacitors, converters, or combinations thereof. For example, the inverter 81 may be an inverter that includes any number of switching units, the power controller 75 may include rectifying circuitry that converts the alternating current of the electric machine 79 into direct current to recharge the power source 77 (e.g., the generator 50 recharging the battery 12 during regenerative braking), and/or the linking capacitor 91 may be configured to couple one or a plurality of inverters to a power source.

A current inductor cooling strategy for hybrid vehicles includes splashing transmission fluid onto the inductor via the internal gears within the transmission. At times, however, this strategy may not provide sufficient cooling. This strategy makes the cooling capability largely dependent on the vehicle speed, which effectively cools the inductor at high vehicle speed, since the gears within the transmission will be splashing the transmission fluid at a high rotational speed. However, under low vehicle speeds, where the gears within the transmission will be splashing the transmission fluid at a low rotational speed, the transmission fluid may not reach the inductor or a reduced amount of transmission fluid may reach the inductor, resulting in a reduction in the cooling of the inductor.

Hybrid vehicles may operate at low vehicle speeds under conditions that require high inductor current, such as off-roading, towing, or supplying energy to high power auxiliary equipment (e.g., Autonomous Vehicles with A/C). Under such conditions, the current cooling strategy may be insufficient due to the reduced cooling at low vehicle speeds. High current conditions for long durations may inflict high thermal stress on the inductor. Without sufficient cooling, the inductor may reach its operating temperature limit under these conditions. Consequently, the control strategy of the hybrid vehicle may reduce the vehicle power output to prevent damaging the inductor. This reduction in power output may significantly reduce the performance of the hybrid vehicle. A solution to such a problem may include spraying pressurized transmission fluid from a nozzle onto targeted critical cooling surfaces of the inductor. Using pressurized transmission fluid at low vehicle speeds may be advantageous since bearings within the transmission may have less need for transmission fluid lubrication at lower speeds.

Figure 3:
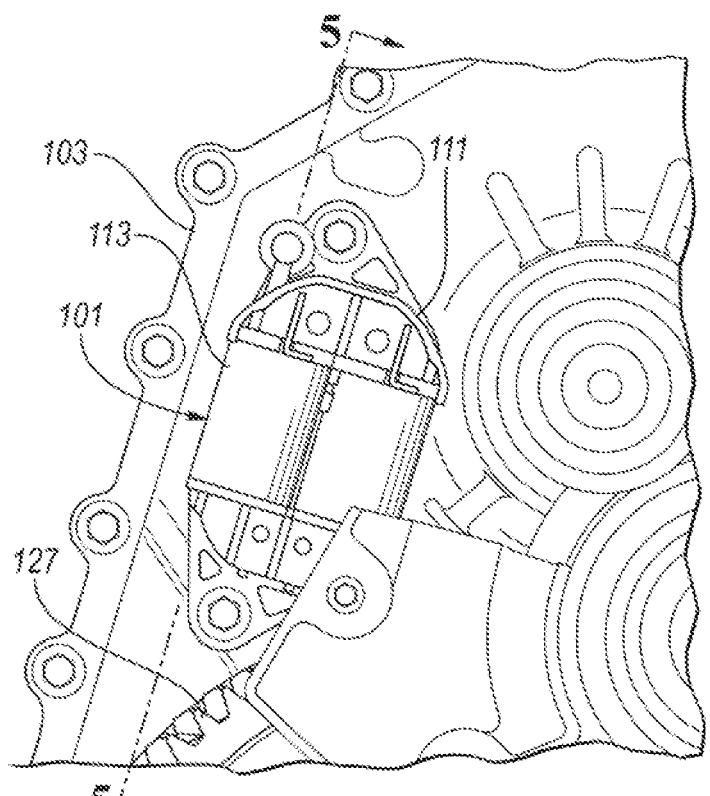
FIG. 3 is an inductor for a voltage converter, which may be a DC to DC boost converter for the hybrid powertrain system.
Figure 4:
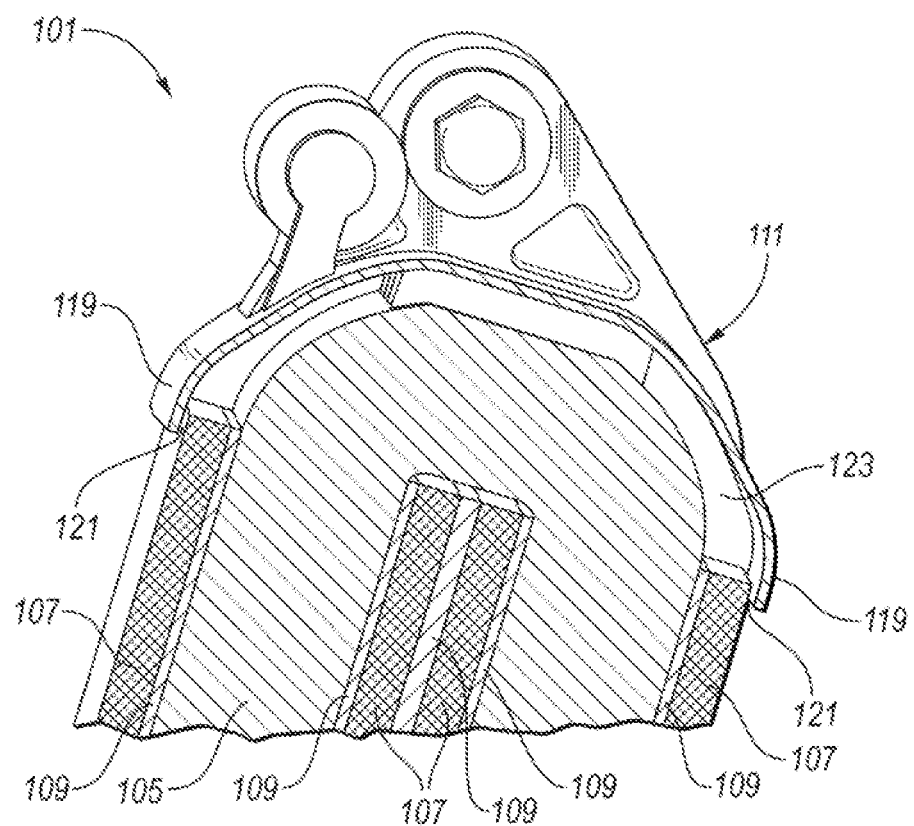
FIG. 4 is a partial cross-section view taken along line 4-4 in FIG. 5.
Figure 5:
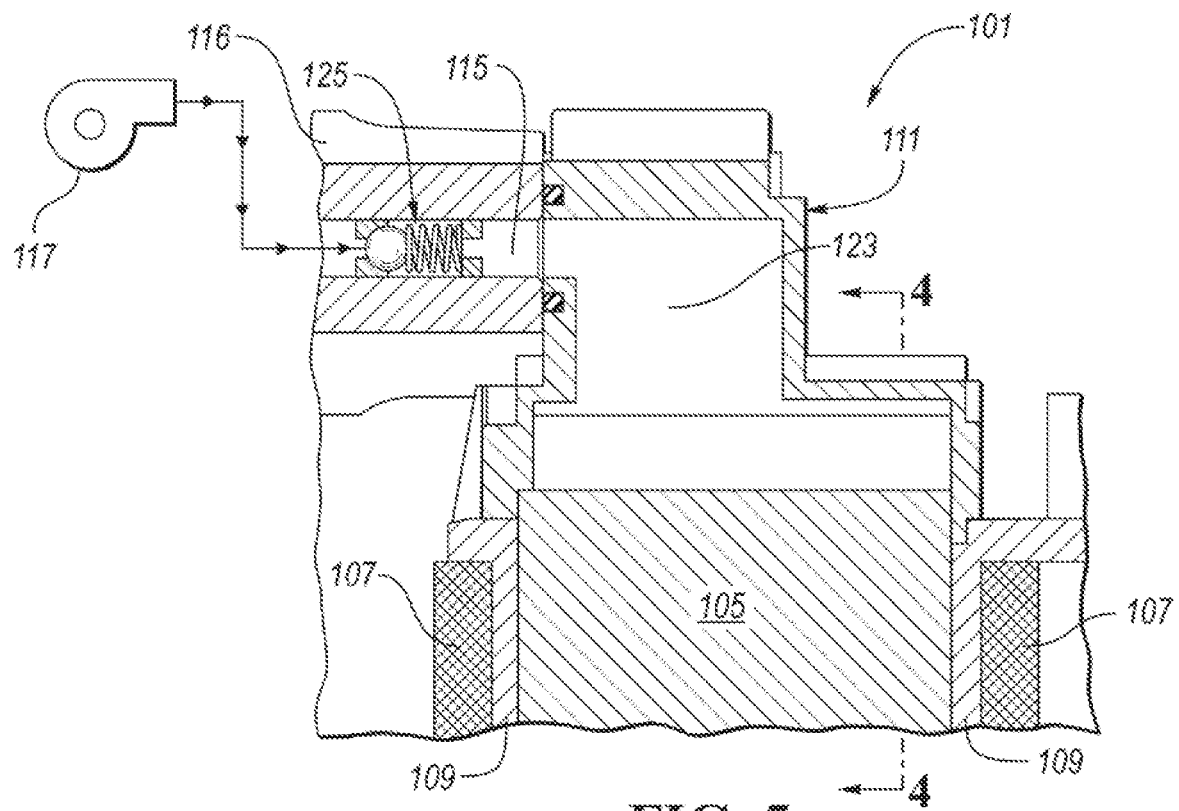
FIG. 5 is a partial cross-section view taken along line 5-5 in FIG. 3.

Referring to FIGS. 3-5, an inductor 101 for the voltage converter 83 is illustrated. In FIG. 3, the inductor 101 is illustrated as being disposed within a housing 103 of a transmission, which may be transmission 14. In alternative embodiments, the hybrid electric vehicle 10 may include a step-ratio transmission and the inductor 101 may be disposed within the housing of the step-ratio transmission. An outer panel of the housing 103 has been removed in FIG. 3 for illustrative purposes. The inductor 101 includes a core 105, which may be made from iron. The core 105 may also be magnetized. The inductor 101 also includes a coil or coil winding 107 that is disposed about the core 105. One or more bobbin structures 109 may be disposed between portions of the coil winding 107 and the core 105.

The inductor 101 includes an end cap or shroud 111 that is disposed over a first end 113 of the inductor 101. The end cap or shroud may be part of the bobbin structures 109 of the inductor 101. The first end 113 of the inductor 101 may be an upper end of the inductor 101. The shroud 111 defines a channel 115 that is in fluid communication with a pump 117. The channel 115 may alternatively be defined or partially defined by a secondary component 116 that is secured to the shroud. The pump 117 is configured to deliver fluid to the inductor 101 via the channel 115 for the purposes of cooling the inductor 101. More specifically, the pump 117 may be a transmission pump that is configured to deliver transmission fluid to the inductor 101 in order to cool the inductor. The transmission pump may also be a subcomponent of a transmission (e.g., transmission 14 or a step-ratio transmission) that is configured to deliver transmission fluid to actuate clutches and/or brakes within the transmission, to lubricate parts (e.g., gears, shafts, bearings, etc.) within the transmission, and/or to deliver transmission fluid to cool the winding of an electric machine (e.g., motor 46 or generator 50). The shroud 111 may include one or more outer ends or overhanging portions 119 that overhang the coil winding 107.

The shroud 111 defines at least one nozzle 121 that is in fluid communicating with the channel 115 and is configured to direct fluid from the channel 115 onto the coil winding 107 for the purposes of cooling the coil winding 107. The at least one nozzle 121 may be defined along one or more of the overhanging portions 119 of the shroud 111. The at least one nozzle 121 may also be configured to direct the fluid from channel 115 downward from one or more of the overhanging portions 119 onto the coil winding 107. The shroud 111 may more specifically include first and second nozzles 121 that are defined on opposing sides of the shroud 111, which are configured to direct fluid onto opposing sides of the coil winding 107. The first and second nozzles 121 may be narrowed gaps that are between outer surfaces of the coil winding 107 and the overhanging portions 119 of the shroud 111. Alternatively, the nozzles 121 may be small orifices or pin holes that are defined within the outer housing or casing the shroud 111.

The shroud 111 may also define a fluid reservoir 123 that is in fluid communication with the channel 115 and the at least one nozzle 121. The fluid reservoir 123 establishes fluid communication between the channel 115 and the at least one nozzle 121. The fluid reservoir 123 is configured to store fluid within the shroud 111. The fluid reservoir 123 or any channels that may be formed within or by the fluid reservoir 123 may be adjacent to the core 105 such that a fluid flowing through fluid reservoir 123 or any channels that may be formed within or by the fluid reservoir 123 may also cool the core 105. The narrowing that occurs between the fluid reservoir 123 and any outlet of the shroud, whether it be pin holes or simply an open space between the overhanging portions 119 of the shroud 111 and outer surfaces of the coil winding 107 that form the nozzles 121, creates a nozzle effect which increase the velocity of the fluid being ejected from the nozzles 121 and onto the coil winding 106, which in turn increases the cooling of the coil winding 107. A check valve 125 may disposed within the channel 115 between the pump 117 and the at least one nozzle 121. The check valve 125 is configured to prevent fluid from backflowing out of the reservoir 123, through the channel 115, and toward the pump 117.

As the speed of the vehicle 10 increases, one or more gears 127 within the transmission case 103 may begin to splash transmission fluid onto the inductor 101, or more specifically onto the coil winding 107 of the inductor 101. Such splashing may begin to replace the cooling necessity of the pressurized fluid being sprayed onto the inductor 101 via the at least one nozzle 121. Furthermore, such splashing may begin to overwhelm the one or more of the nozzles 121 of the at least one nozzle 121 and force transmission fluid from the housing 103 into the fluid reservoir 123 of the shroud via the nozzles 121 that are being overwhelmed. If only a portion of the nozzles 121 are being overwhelmed by the splashing, the nozzles 121 that are not being overwhelmed may continue to discharge fluid onto the coil winding 107 to cool the coil winding 107, while the nozzles 121 that are being overwhelmed may continue to intake fluid from the housing 103 and store such fluid in the reservoir 123. The reservoir 123 may then redirect such fluid to nozzles 121 that are still being utilized to cool the coil winding 107 or may redirect such fluid to a fluid channel (not shown) that is configured to deliver the fluid to another vehicle system or component. Another vehicle system or component may include a clutch or lubricating point within a transmission (e.g., transmission 14 or a step-ratio transmission) or may include the winding of an electric machine (e.g., motor 46 or generator 50), which may require cooling. A check valve (not shown) may be disposed within such a fluid channel to prevent fluid from flowing from the reservoir 123 and to another vehicle system or component as long as the fluid pressure within the reservoir is less than a threshold in order to ensure that the nozzles 121 that are still being utilized to cool the coil winding 107 have a sufficient supply of fluid to cool the coil winding 107.

A key advantage of replacing the pressurized spray from the nozzles 121 with splashing transmission fluid includes saving energy by reducing the amount of transmission fluid that needs to be pumped through the transmission system. There are several ways to govern transmission fluid flow control in the nozzles 121. The nozzles 121 may be oriented such that they capture enough splashing transmission fluid to generate enough pressure inside the nozzles 121 and/or inside the reservoir 123 to prevent fluid from flowing from the pump 117 to the specific nozzles 121 and/or the reservoir 123. Alternatively, a mechanically or electromagnetically actuated valve may control transmission fluid flow from the activated pump 117 to the nozzles 121. Deactivating the pump 117 that controls pressurized transmission fluid flow will also stop the flow to the nozzles 121.

Above certain high vehicle speeds, the splashing transmission fluid may overwhelm the inductor 101 effectively cooling it entirely. Thus, pressurized transmission fluid spray via the nozzles 121 may not be required for cooling the inductor 101 under such conditions. Furthermore, while under such conditions, the transmission fluid may be captured by the nozzles 121 and redirected for other uses via a fluid channel that may include a check valve (as described above), such as actuating a clutch in the transmission, lubricating bearings, or cooling the windings of an electric machine (e.g., motor 46 or generator 50). The reservoir 123 has an internal volume that continues to supply fluid to the at least one nozzle 121 for cooling the inductor 101 for a certain period of time after the vehicle speed has deceased such that splashing no longer reaches the inductor 101 or after the pump 117 stops delivering fluid. It should be noted that although FIGS. 3-5 depict the nozzles 121 along two sides of the overhanging portion 119 of the shroud 111, the nozzles 121 may be formed along all of the sides of the shroud 11 or more particularly along an entire peripheral boundary of the overhanging portion 119 of the shroud 111.

The words used in the specification are words of description rather than limitation, and it is understood that various changes may be made without departing from the spirit and scope of the disclosure. As previously described, the features of various embodiments may be combined to form further embodiments that may not be explicitly described or illustrated. While various embodiments could have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. As such, embodiments described as less desirable than other embodiments or prior art implementations with respect to one or more characteristics are not outside the scope of the disclosure and may be desirable for particular applications.

What is claimed is:

1. A vehicle comprising:
   an electric machine configured to propel the vehicle;
   a battery configured to deliver electrical power to the electric machine;
   an electrical circuit configured to convert direct current power from the battery into alternating current power and to deliver the alternating current power to the electric machine; and
   a boost converter having an inductor and configured to increase the battery voltage being input into the electrical circuit,
   the inductor comprising,
   a core,
   a coil,
   a shroud disposed only over a first end of the inductor, wherein the shroud defines a channel that is in fluid communication with a transmission pump, and wherein the shroud defines at least one nozzle that is in fluid communicating with the channel and is configured to direct transmission fluid onto the coil, and
   a check valve disposed within the channel between the transmission pump and the at least one nozzle, wherein the check valve is configured to prevent transmission fluid from backflowing through the channel toward the transmission pump.

2. The vehicle of claim 1, wherein the shroud has an outer end that defines the at least one nozzle and overhangs the coil.

3. The vehicle of claim 2, wherein the at least one nozzle is oriented to direct transmission fluid downward from the outer end of the shroud and onto the coil.

4. The vehicle of claim 1, wherein the shroud defines a reservoir that is configured to store transmission fluid.

5. The vehicle of claim 4, wherein the reservoir establishes fluid communication between the channel and the at least one nozzle.

6. The vehicle of claim 1, wherein the at least one nozzle includes first and second nozzles.

7. The vehicle of claim 6, wherein the first and second nozzles are disposed on opposing sides of the coil and are configured to direct transmission fluid onto opposing sides of the coil, respectively.

8. An inductor for a boost converter in a hybrid vehicle comprising:
   a core;
   a coil winding disposed about the core; and
   an end cap disposed only over a first end of the inductor, overhanging the coil winding, defining a channel that is configured to receive fluid from a pump, defining at least one nozzle that is configured to direct fluid from an overhanging portion of the end cap and onto the coil, and defining a fluid reservoir that is in fluid communication with the channel and the at least one nozzle.

9. The inductor of claim 8 further comprising a check valve disposed within the channel between the pump and the at least one nozzle, wherein the check value is configured to prevent fluid from backflowing through the channel toward the pump.

10. The inductor of claim 8, wherein the at least one nozzle includes first and second nozzles.

11. The inductor of claim 10, wherein the first and second nozzles are disposed on opposing sides of the coil and are configured to direct transmission fluid onto opposing sides of the coil, respectively.

12. The inductor of claim 8, wherein the at least one nozzle is oriented to direct fluid downward from the overhanging portion of the end cap and onto the coil.

13. The inductor of claim 8, wherein the reservoir establishes fluid communication between the channel and the at least one nozzle.

14. An inductor for a boost converter in a hybrid vehicle comprising:
   a core;
   a coil winding disposed about the core; and
   a shroud disposed only over an upper end of the inductor, the shroud defining a channel that is configured to receive fluid from a pump and having an outer end that overhangs the coil winding, the outer end defining at least one nozzle that is configured to direct fluid from the channel and downward onto the coil.

15. The inductor of claim 14, wherein the shroud defines a reservoir that is configured to store transmission fluid.

16. The inductor of claim 15, wherein the reservoir establishes fluid communication between the channel and the at least on nozzle.

17. The inductor of claim 15 further comprising a check valve disposed within the channel between the pump and the at least one nozzle, wherein the check value is configured to prevent fluid from backflowing through the channel toward the pump.

18. The inductor of claim 14, wherein the at least one nozzle includes first and second nozzles.

19. The inductor of claim 18, wherein the first and second nozzles are disposed on opposing sides of the coil and are configured to direct transmission fluid onto opposing sides of the coil, respectively.

* * * * *